US010269397B2

(12) United States Patent
Lee

(10) Patent No.: US 10,269,397 B2
(45) Date of Patent: Apr. 23, 2019

(54) APPARATUSES AND METHODS FOR PROVIDING ACTIVE AND INACTIVE CLOCK SIGNALS

(71) Applicant: MICRON TECHNOLOGY, INC., Boise, ID (US)

(72) Inventor: Hyun Yoo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/692,993

(22) Filed: Aug. 31, 2017

(65) Prior Publication Data

US 2019/0066741 A1 Feb. 28, 2019

(51) Int. Cl.
*G11C 8/00* (2006.01)
*G11C 7/22* (2006.01)

(52) U.S. Cl.
CPC .................... *G11C 7/222* (2013.01)

(58) Field of Classification Search
CPC ......... G11C 7/22; G11C 7/222; G11C 7/1072; G11C 7/1051; G11C 7/1066
USPC ............................. 365/233.1, 233.11, 233.12
See application file for complete search history.

(56) References Cited

U.S. PATENT DOCUMENTS

| | | | |
|---|---|---|---|
| 6,029,252 A | 2/2000 | Manning | |
| 6,178,133 B1 | 1/2001 | Manning | |
| 6,178,488 B1 | 1/2001 | Manning | |
| 6,202,119 B1 | 3/2001 | Manning | |
| 6,279,090 B1 | 8/2001 | Manning | |
| 6,301,322 B1 | 10/2001 | Manning | |
| 6,338,127 B1 | 1/2002 | Manning | |
| 6,434,684 B1 | 8/2002 | Manning | |
| 6,446,180 B2 | 9/2002 | Li | |
| 6,484,244 B1 | 11/2002 | Manning | |
| 6,598,171 B1 | 7/2003 | Farmwald et al. | |
| 7,103,855 B2 | 9/2006 | Saeki | |
| 9,531,363 B2 | 12/2016 | Miyano | |
| 2001/0028599 A1 | 10/2001 | Aikawa | |
| 2007/0086267 A1* | 4/2007 | Kwak | G11C 7/02 365/233.1 |

(Continued)

OTHER PUBLICATIONS

U.S. Appl. No. 15/445,795 entitled 'Apparatuses and Methods for Providing Internal Memory Commands and Control Signals in Semiconductor Memories' filed Feb. 28, 2017.

(Continued)

*Primary Examiner* — Son Dinh
(74) *Attorney, Agent, or Firm* — Dorsey & Whitney LLP

(57) ABSTRACT

Apparatuses and methods for providing active an inactive clock signals are disclosed. An example apparatus includes an input clock buffer and a clock divider circuit. The input clock buffer includes a receiver circuit configured to receive first and second clock signals or first and second constant voltages. The receiver circuit is further configured to provide first and second output signals based on the complementary clock signals or the first and second constant voltages. The first and second clock signals are complementary and the second constant voltage is less than the first constant voltage. The clock divider circuit is configured to receive the first and second output signals and provide multiphase clock signals based on the first and second output signals from the input clock buffer.

20 Claims, 9 Drawing Sheets

(56) References Cited

U.S. PATENT DOCUMENTS

| | | |
|---|---|---|
| 2007/0133332 A1* | 6/2007 | Chun .................. G11C 7/1072 |
| | | 365/222 |
| 2008/0056019 A1 | 3/2008 | Kim et al. |
| 2008/0291759 A1 | 11/2008 | Lee |
| 2010/0254198 A1 | 10/2010 | Bringivijayaraghavan et al. |
| 2011/0116330 A1 | 5/2011 | Kim et al. |
| 2011/0316599 A1 | 12/2011 | Kwak |
| 2013/0265835 A1 | 10/2013 | Lee |
| 2013/0329503 A1 | 12/2013 | Bringivijayaraghavan |
| 2014/0010025 A1 | 1/2014 | Bringivijayaraghavan |
| 2014/0015575 A1 | 1/2014 | Jung |
| 2014/0055184 A1 | 2/2014 | Vankayala |
| 2015/0235691 A1 | 8/2015 | Kwak |
| 2017/0140808 A1 | 5/2017 | Jung et al. |

OTHER PUBLICATIONS

U.S. Appl. No. 15/445,935 entitled 'Apparatuses and Methods for Determining a Phase Relationship Between an Input Clock Signal and a Multiphase Clock Signal' filed Feb. 28, 2017.
U.S. Appl. No. 16/143,082, titled "Apparatuses and Methods for Determining a Phase Relationship Between an Input Clock Signal and a Multiphase Clock Signal", filed Sep. 26, 2018.
U.S. Appl. No. 16/138,517, titled "Apparatuses and Methods for Providing Internal Memory Commands and Control Signals in Semiconductor Memories", filed Sep. 21, 2018, pp. all.
International Search Report and Written Opinion dated Dec. 3, 2018 for PCT Application No. PCT/US2018/046714, 14 pages.

* cited by examiner

APPARATUSES AND METHODS FOR PROVIDING ACTIVE AND INACTIVE CLOCK SIGNALS

BACKGROUND

Semiconductor memories are used in many electronic systems to store data that may be retrieved at a later time. As the demand has increased for electronic systems to be faster, have greater computing ability, and consume less power semiconductor memories that may be accessed faster, store more data, and use less power have been continually developed to meet the changing needs. Part of the development includes creating new specifications for controlling and accessing semiconductor memories, with the changes in the specifications from one generation to the next directed to improving performance of the memories in the electronic systems.

Semiconductor memories are generally controlled by providing the memories with command signals, address signals, clock signals. The various signals may be provided by a memory controller, for example. The command signals may control the semiconductor memories to perform various memory operations, for example, a read operation to retrieve data from a memory, and a write operation to store data to the memory. The data may be provided between the controller and memories with known timing relative to receipt of an associated command by the memory. The known timing is typically defined by latency information. The latency information may be defined by numbers of clock cycles of system clock signals CK and CKF. The memories may be provided with system clock signals that are used for timing command signals and address signals, for example, and further provided with data clock signals that are used for timing read data provided by the memory and for timing write data provided to the memory. The memories may also provide clock signals to the controller for timing the provision of data provided to the controller.

Generation of internal signals by the memories, such as internal clock signals, consume power. In electronic systems where low power consumption is a priority, memory designs that reduce power consumption, for example, power consumed when generating internal signals, maybe desirable.

DETAILED DESCRIPTION

Certain details are set forth below to provide a sufficient understanding of examples of the disclosure. However, it will be clear to one having skill in the art that examples of the disclosure may be practiced without these particular details. Moreover, the particular examples of the disclosure described herein should not he construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

Figure 1:
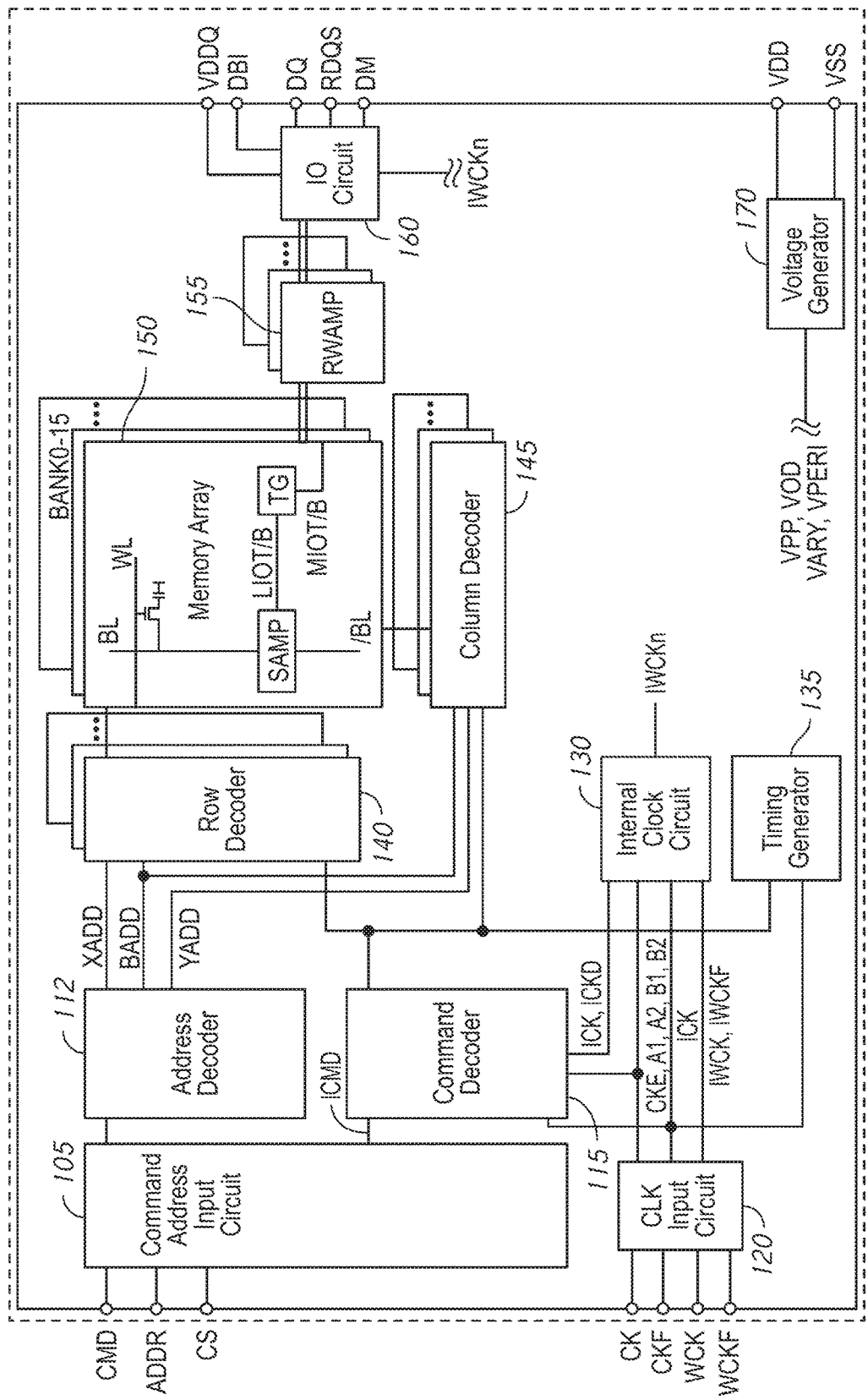
FIG. 1 is a block diagram of an apparatus according to an embodiment of the disclosure.

FIG. 1 is a block diagram of an apparatus according to an embodiment of the disclosure. The apparatus may include a semiconductor dev ice 100. In some embodiments, the semiconductor device 100 may include, without limitation, a DRAM device, such as low power DDR (LPDDR) memory integrated into a single semiconductor chip, for example. The semiconductor device 100 may be mounted on an external substrate, for example, a memory module substrate, a mother board or the like. The semiconductor device 100 may further include a memory array 150. The memory array 150 includes a plurality of banks, each bank including a plurality of word lines WL, a plurality of bit lines BL, and a plurality of memory ceils MC arranged at intersections of the plurality of word lines WL and the plurality of bit lines BL. The selection of the word line WL is performed by a row decoder 140 and the selection of the bit line BL Is performed by a column decoder 145. Sense amplifiers (SAMP) are located for their corresponding bit lines BL and connected to at least one respective local I/O line pair (LIOT/B), which is in turn coupled to at least respective one main I/O line pair (MIOT/B), via transfer gates (TG), which function as switches.

The semiconductor device 100 may employ a plurality of external terminals that include command and address terminals coupled to a command bus and an address bus to receive command signals CMD and address signals ADDRESS, respectively, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ.

The command terminals and address terminals may be supplied with an address signal and a bank address signal from outside. The address signal and the bank address signal supplied to the address terminals are transferred, via a command/address input circuit 105, to an address decoder 112. The address decoder 112 receives the address signals and supplies a decoded row address signal to the row decoder 140, and a decoded column address signal to the column decoder 145. The address decoder 112 also receives the bank address signal and supplies the bank address signal to the row decoder 140, the column decoder 145.

The command and address terminals may further be supplied with command signals CMD from and address signals ADDR, and selection signal CS, for example, a memory controller. The command signals may represent various memory commands from the memory controller, for example, access commands. The access commands may include, for example, read commands and write commands. The select signal CS is used to select the semiconductor device 100 to respond to commands and addresses provided to the command and address terminals. When an active CS signal is provided to the semiconductor device 100, the commands and addresses are received and memory operations are performed. The command signals CMD may be provided as internal command signals ICMD to a command decoder 115 via the command/address input circuit 105. The command decoder 115 includes circuits to decode the internal command signals ICMD to generate various internal signals and commands for performing memory operations, for example, a row command signal to select a word line and a column command signal to select a bit line.

When a read command is issued and a row address and a column address are timely supplied with the read command, read data is read from memory cells in the memory array 150 designated by these row address and column address. The read command is received by the command decoder 115, which provides internal commands to input/output circuit 160 so that read data is output to outside from the data terminals DQ, RDQS, DBI and DMI via read/write amplifiers 155 and the input-output circuit 160 according to the RDQS clock signals. The read data is provided at a time defined by read latency information RL that may be programmed in the semiconductor device, for example, in a mode register (not shown in FIG. 1). The read latency information RL may be defined in terms of clock cycles of the CK clock signal. For example, the read latency information RL may be a number of clock cycles of the CK signal after the read command is received by the semiconductor device 100 when the associated read data is provided.

When the write command is issued and a row address and a column address are timely supplied with this command, then write data is supplied to the data terminals DQ, DBI, and DMI according to the WCK and WCKF clock signals. The write command is received by the command decoder 115, which provides internal commands to the input/output circuit 160 so that the write data is received by data receivers in the input/output circuit 160, and supplied via the input/output circuit 160 and the read/write amplifiers 155 to the memory array 150. The write data is written in the memory cell designated by the row address and the column address. The write data is provided to the data terminals at a time that is defined by write latency WL information. The write latency WL information may be programmed in the semiconductor device 100, for example, in the mode register (not shown in FIG. 1). The write latency WL information may be defined in terms of clock cycles of the CK clock signal. For example, the write latency information WL may be a number of clock cycles of the CK signal after the write command is received by the semiconductor device 100 when the associated write data is received.

Turning to the explanation of the external terminals included in the semiconductor device 100. the clock terminals and data clock terminals are supplied with external clock signals and complementary external clock signals. The external clock signals CK, CKF, WCK, WCKF may be supplied to a clock input circuit 120. The CK and CKF signals are complementary, and the WCK and WCKF signals are complementary. Complementary clock signals have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 receive the external clock signals. For example, an input buffer receives the CK and CKF signals when enabled by a CKE signal from the command decoder 115 and an input buffer receives the WCK and WCKF signals. The clock input circuit 120 may receive the external clock signals to generate internal clock signals ICK and IWCK and IWCKF. The internal clock signals ICK and IWCK and IWCKF are supplied to internal clock circuits 130.

The internal clock circuits 130 includes circuits that provide various phase and frequency controlled internal clock signals based on the received internal clock signals. For example, the internal clock circuits 130 may include a clock path (not shown in FIG. 1) that receives the ICK clock signal and provides internal clock signals ICK and ICKD to the command decoder 115, The internal clock circuits 130 may further include a data clock path that receives the IWCK and IWCKF clock signals and provides multiphase clock signals IWCKn based on the internal clock signals IWCK and IWCKF. As will be described in more detail below, the multiphase clock signals IWCKn have relative phases with each other and have a phase relationship with the WCK and WCKF clock signals. The multiphase clock signals IWCKn may also be provided to the input output circuit 160 for controlling an output timing of read data and the input tinting of write data. The input/output circuit 160 may include clock circuits and driver circuits for generating and providing the RDQS signal.

The power supply terminals are supplied with power supply potentials VDD and VSS. These power supply potentials VDD and VSS are supplied to an internal voltage generator circuit 170. The internal voltage generator circuit 170 generates various internal potentials VPP, VOD, VARY, VPERI, and the like and a reference potential ZQVREF based cm the power supply potentials VDD and VSS. The internal potential VPP is mainly used in the row decoder 140, the internal potentials VOD and VARY are mainly used in the sense amplifiers included in the memory array 150, and the internal potential VPERI is used in many other circuit blocks.

The power supply terminal is also supplied with power supply potential VDDQ. The power supply potentials VDDQ is supplied to the input output circuit 160 together with the power supply potential VSS. The power supply potential VDDQ may be the same potential as the power supply potential VDD in an embodiment of the disclosure. The power supply potential VDDQ may be a different potential from the power supply potential VDD in another embodiment of the disclosure. However, the dedicated power supply potential VDDQ is used for the input/output circuit 160 so that power supply noise generated by the input/output circuit 160 does not propagate to the other circuit blocks.

Figure 2:
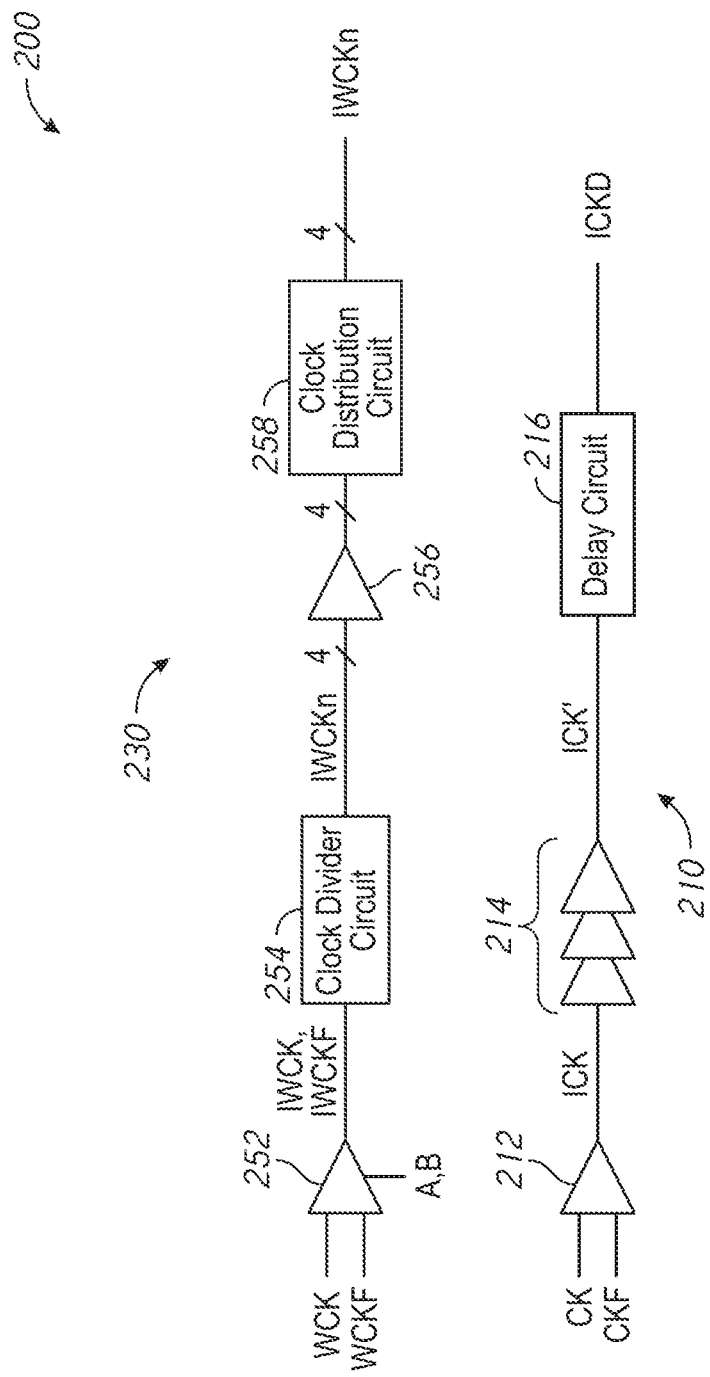
FIG. 2 is a block diagram of a clock path and a data clock path according to an embodiment of the disclosure.

FIG. 2 is a block diagram of a clock path 210 and a data clock path 230 according to an embodiment of the disclosure. The clock path 210 and data clock path 230 may be included in the semiconductor device 100 of FIG. 1 in some embodiments of the disclosure. For example, the data clock path 230 may be included in the clock input circuit 120 and the internal clock circuit 130 of the semiconductor device 100 of FIG. 1. One or both of the clock path 210 and the data clock path 230 may be modified from the embodiment illustrated in FIG. 2 without departing from the scope of the present disclosure.

The clock path 210 may include an input buffer 212 that receives complementary clock signals CK and CKF and provides an internal clock signal ICK. The input buffer 212 may be included in the clock input circuit 120 of FIG. 1 in some embodiments of the disclosure. The internal clock signal ICK is based on the CK and CKF clock signals. Repeater circuits 214 receive the ICK clock signal and provide an ICK' clock signal to a delay circuit 216. The repeater circuits 214 drive the ICK' clock signal over a clock line from the input buffer 212 to the delay circuit 216. The ICK' clock signal is delayed by the delay circuit 216 to provide a delayed ICK clock signal ICKD. The ICK' and ICKD signals may be used by a command path (not shown) for timing the decoding and provision of internal command signals to perform memory operations (e.g., read, write, etc.).

The data clock path 230 includes an input buffer 252. The input buffer 252 receives complementary clock signals WCK and WCKF and provides the complementary internal clock signals IWCK and IWCKF based on the WCK and WCKF clock signals. In an embodiment of the disclosure, the IWCK and IWCK clock signals have a same clock frequency as a clock frequency of the WCK and WCKF clock signals, and the IWCK clock-signal corresponds to the WCK clock signal and the IWCKF clock signal corresponds to the WCKF clock signal. The input buffer 252 receives activation signals A1, A2, B1, and B2. Based on the activation signals A1, A2, B1, and B2, the input buffer may provide as the IWCK and IWCKF signals the WCK and WCKF signals or constant voltage signals. The input buffer 252 may be included in the clock input circuit 120 of FIG. 1 in some embodiments of the disclosure.

The IWCK and IWCKF clock signals are provided to a clock divider circuit 254 that is configured to provide multiphase clock signals IWCK0, IWCK90, IWCK180, IWCK270 (collectively referred to as the multiphase clock signals IWCKn). The multiphase clock signals have relative phases to one another, and have a clock frequency that is less than a clock frequency of the WCK and WCKF clock signals (and the IWCK and IWCKF signals). In an embodiment of the disclosure, the IWCK0, IWCK90, IWCK180, and IWCK270 clock signals have a clock frequency dial is one-half the clock frequency of the WCK and WCKF clock signals.

In an embodiment of the disclosure, the IWCK0, IWCK90, IWCK180, and IWCK270 clock signals have a relative phase of 90 degrees to one another. For example, the IWCK90 clock signal has a phase of 90 degrees relative to the IWCK0 clock signal, the IWCK 180 clock signal has a phase of 180 degrees relative to the IWCK0 clock signal (and a phase of 90 degrees relative to the IWCK90 clock signal), and the IWCK270 clock signal has a phase of 270 degrees relative to the IWCK0 clock signal (and a phase of 90 degrees relative to the IWCK180 clock signal). In such a case, the multiphase clock signals IWCK0, IWCK90, IWCK180, IWCK270 may be referred to as "quadrature" phase clock signals.

The multiphase clock signals are provided to repeater circuits 256. The repeater circuits 256 include a repeater circuit for each of the multiphase clock signals IWCKn. The repeater circuits 256 drive the multiphase clock signals IWCKn over clock lines from the clock divider circuit 254 to a clock distribution circuit 258. The clock distribution circuit 258 provides the multiphase clock signals IWCKn to various circuitries that operate according to the multiphase clock signals. For example, the multiphase clock signals IWCKn may be provided to clock input/output circuits (not shown in FIG. 2) to provide and receive data.

Figure 3:
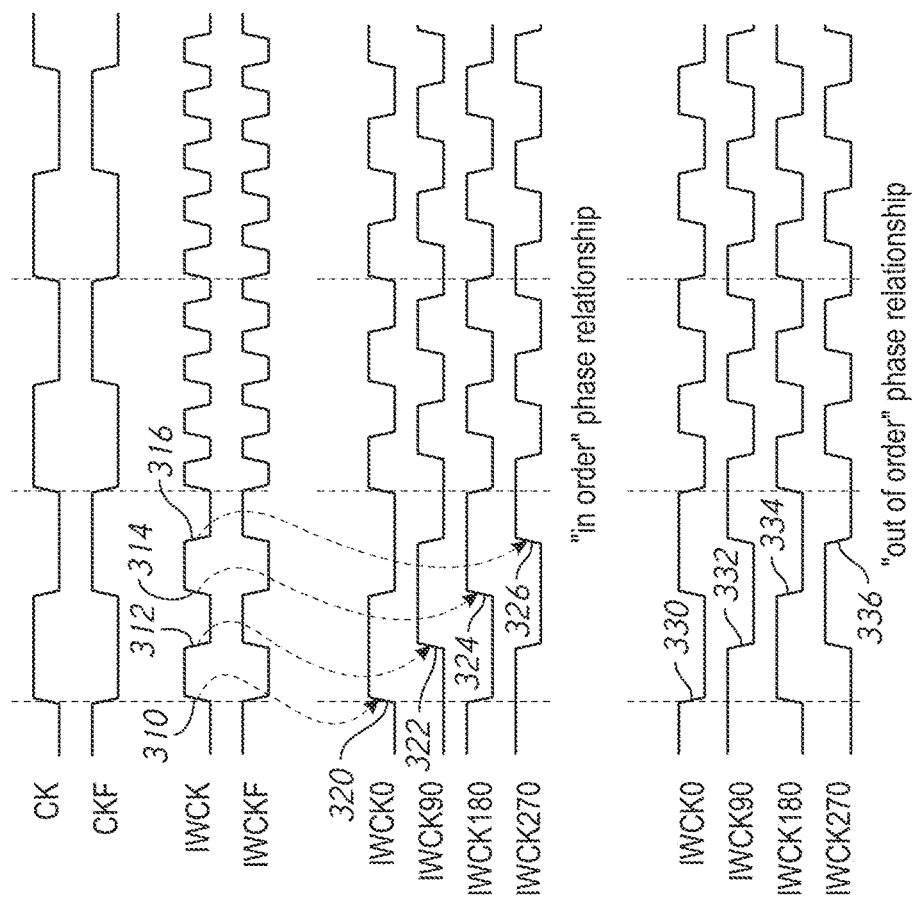
FIG. 3 is a timing diagram showing a first phase relationship and a second phase relationship between clock signals according to an embodiment of the disclosure.

As previously described, the IWCK0, IWCK90, IWCK180, IWCK270 signals provided by the clock divider circuit 254 are based on the IWCK and IWCKF signals. The IWCK0, IWCK90, IWCK180, IWCK270 signals may have a phase relationship relative to the IWCK and IWCKF signals, and likewise, with the WCK and WCKF signals (from which the IWCK and IWCKF signals are based) and relative to the CK and CKF signals. For example, the multiphase clock signals IWCK0, IWCK90, IWCK180, and IWCK270 provided by the clock divider circuit 254 may have one of two phase relationships relative to the WCK and WCKF clock signals, and the CK and CKF signals. A first phase relationship and a second phase relationship are illustrated in FIG. 3.

In the first phase relationship, a rising edge 320 of the IWCK0 clock signal is associated with a first rising edge 310 of the IWCK clock signal (and the WCK signal, not shown in FIG. 3) and a first rising edge of the CK signal, a rising edge 322 of the IWCK90 clock signal is associated with a first falling edge 312 of the IWCK clock signal, a rising edge 324 of the IWCK180 clock signal is associated with a second rising edge 314 of the IWCK clock signal and a first falling edge of the CK signal, and a rising edge 326 of the IWCK270 clock signal is associated with a second falling edge 316 of the IWCK clock signal The first phase relationship may be referred to as an "in order" phase relationship.

In the second phase relationship, a falling edge 330 of the IWCK0 clock signal is associated with the first rising edge 310 of the IWCK clock signal (and the WCK signal) and a first rising edge of the CK signal, a falling edge 332 of the IWCK90 clock signal is associated with the first falling edge 312 of the IWCK clock signal, a falling edge 334 of the IWCK180 clock signal is associated with the second rising edge 314 of the IWCK clock signal and a first falling edge of the CK signal, and a falling edge 336 of the IWCK270 clock signal is associated with the second falling edge 316 of the IWCK clock signal. The second phase relationship may be referred to as an "out of order" phase relationship.

The phase relationship of the multiphase clock signals IWCKn provided by the clock divider circuit 254 may not be known until a determination is made. The phase relationship of the multiphase clock signals IWCKn may be determined, for example, by evaluating at least one of the multiphase clock signals. The phase relationship may be determined during a WCK-CK synchronization process.

Determining the phase relationship of the multiphase clock signals IWCKn to the WCK and WCKF signals may be needed because proper operation of the semiconductor device 100 may be based on the multiphase clock signals having one of the phase relationships. For example, read data may be provided by the semiconductor device 100 properly when the multiphase clock signals have the "in order" phase relationship. In such an example, when it is determined that the multiphase clock signals IWCKn have the "out of order" phase relationship, various ones of the multiphase clock signals may be switched to provide "in order" multiphase clock signals. As an example, the IWCK180 clock signal and the IWCK0 clock signal of the out of order multiphase clock signals may be switched and the IWCK270 clock signal and the IWCK90 clock signal of the out of order multiphase clock signals may be switched. As a result, the "out of order" multiphase clock signals are switched into "in order" multiphase clock signals.

Figure 4:
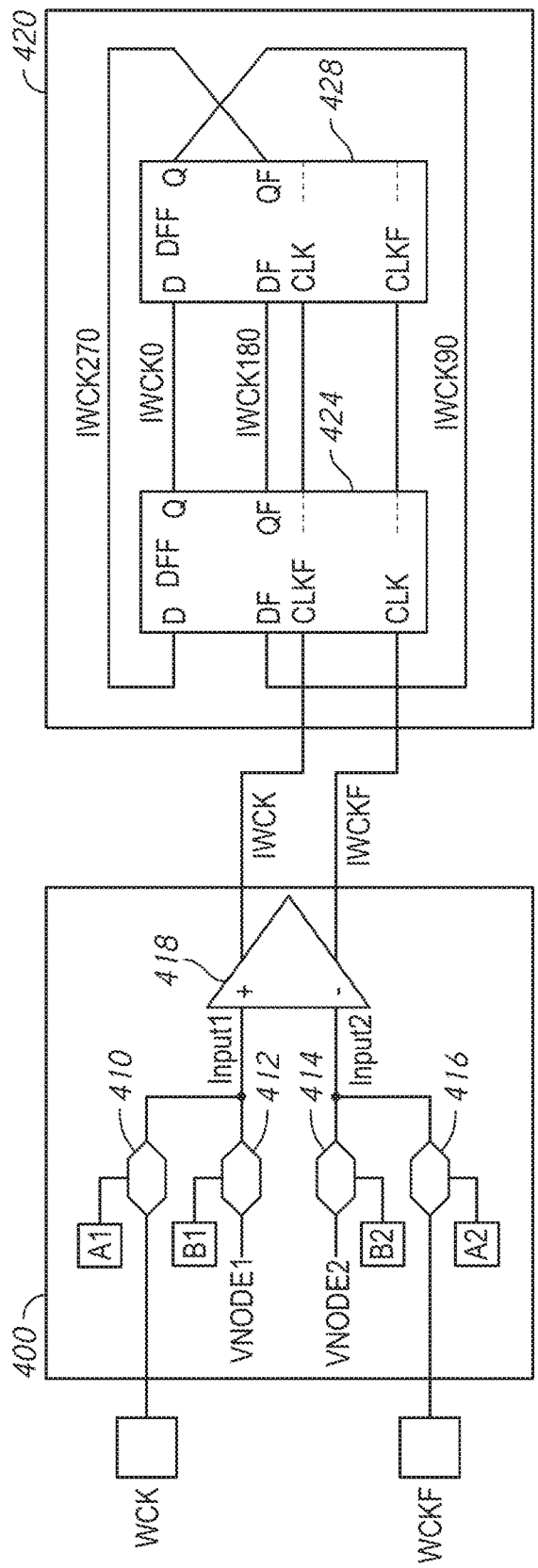
FIG. 4 is a schematic diagram of a clock input buffer and a clock divider circuit according to an embodiment of the disclosure.

FIG. 4 is a schematic diagram of a clock input buffer 400 and a clock divider circuit 420 according to an embodiment of the disclosure. In some embodiments of the disclosure, the clock input buffer 400 and the clock divider circuit 420 may be included in the clock input buffer 252 and the clock divider circuit 254, respectively, of FIG. 2.

The clock input buffer 400 includes switch circuits 410, 412, 414, and 416, and further includes a receiver circuit 418. The switch circuit 410 receives the WCK signal and when activated by an active activation signal A1 (e.g., active high logic level) provides the WCK signal to an input INPUT1 of the receiver circuit 418. The switch circuit 412 receives a voltage VNODE1 and when activated by an active activation signal B1 (e.g., active high logic level) provides the VNODE1 voltage to the input INPUT1 of the receiver circuit 418. The switch circuit 416 receives the WCKF signal and when activated by an active activation signal A2 provides the WCKF signal to an input INPUT2 of the receiver circuit 418. The switch circuit 414 receives a voltage VNODE2 and when activated by an active activation signal B2 provides the VNODE2 voltage to the input INPUT2 of the receiver circuit 418. The receiver circuit 418 provides an output signal IWCK based on the input INPUT1 and provides an output signal IWCKF based on the input INPUT2.

The VNODE1 and VNODE2 voltages are constant voltages. The VNODE1 voltage may be a supply voltage (e.g., VDD) or a reference voltage (e.g., ground). The VNODE2 voltage may also be either the supply voltage or reference voltage, but is the voltage that the VNODE1 voltage is not. For example, when the VNODE1 voltage is the supply voltage the VNODE2 voltage is the reference voltage, and when the VNODE1 voltage is the reference voltage the VNODE2 voltage is the supply voltage. Other voltages may be used for the VNODE1 and VNODE2 voltages in other embodiments of the disclosure.

The activation signals A1, A2, B1, and B2 may be provided by a control logic circuit (not shown in FIG. 4). In some embodiments of the disclosure, the activation signals A1 and A2 are different signals that may have different logic levels, and similarly, the activation signals B1 and B2 are different signals that may have different logic levels. That is, each of the switch circuits 410, 412, 414, and 416 may be activated according to the respective activation signal. For example, the switch circuits 410 and 414 may be active responsive to active A1 and B2 selection signals and the switch circuits 416 and 412 may be deactivated by inactive A2 and B1 selection signals. As a result, the WCK signal is provided to the input INPUT1 and the VNODE2 voltage is provided to the input INPUT2. The previous condition may be used, for example, when the WCK signal is provided to the semiconductor device 100, but the WCKF signal is not provided or not used. That is, a "single ended" clock signal WCK is provided to the semiconductor device 100. In another example, the switch circuits 416 and 412 may be active responsive to active A2 and B1 selection signals and the switch circuits 410 and 414 may be deactivated by inactive A1 and B2 selection signals. As a result, the VNODE1 voltage is provided to the input INPUT1 and the WCKF signal is provided to the input INPUT2. The previous condition may be used, for example, when the WCKF signal is provided to the semiconductor device 100, but the WCK signal is not provided or not used. That is, a single ended clock signal WCKF is provided to the semiconductor device 100.

Figure 5:
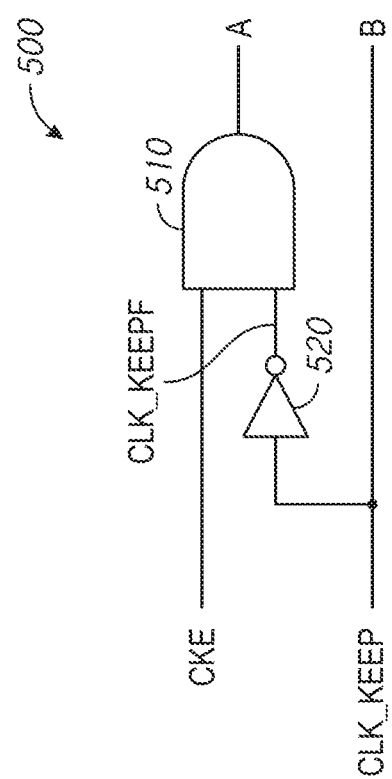
FIG. 5 is a schematic diagram of a control logic circuit according to an embodiment of the disclosure.

In some embodiments of the disclosure, the A1 and A2 signals are activated and deactivated concurrently and the B1 and B2 signals are activated and deactivated concurrently. The A1 and A2 selection signals may be collectively referred to as an A selection signal and the B1 and B2 selection signals may be collectively referred to as a B selection signal. Such a control logic circuit may be included, for example, in command decoder such as command decoder 115 of FIG. 1. FIG. 5 is a schematic diagram of a control logic circuit 500 according to an embodiment of the disclosure. The control logic circuit 500 may be used to provide the activation signals A and B for the clock input buffer 400 of FIG. 4. The A activation signal show in FIG. 5 may be provided as both the A1 and A2 activation signals of FIG. 4 and the B activation signal may be provided as both the B1 and B2 activations signals. In some embodiments of the disclosure, the control logic circuit 500 may be included in the command decoder 115 of FIG. 1.

The control logic circuit 500 includes an AND logic circuit 510 and an inverter 520. The AND logic circuit 510 provides the selection signal A and the CLK_KEEP signal may be provided as the selection signal B. The AND logic circuit 510 receives a clock enable signal CKE at a first input. The CKE signal is active (e.g., active high logic level) when the semiconductor device 100 is active to receive the CK and CKF clock signals. The inverter 520 receives control signal CLK_KEEP and provides the complement CLK_KEEPF signal. The CLK_KEEP signal may be provided by the command decoder based on; for example, the memory command and the timing of the memory command. The AND logic circuit 510 receives the CLK_KEEPF signal from the inverter 520. In operation, the AND logic circuit 510 provides an active A selection signal when the semiconductor device 100 is active (e.g., the CKE signal is active) and when the CLK_KEEP signal is inactive (e.g., the B selection signal is inactive) and the AND logic circuit 510 provides an inactive A selection signal when the semiconductor device 100 is active (e.g., the CKE signal is active) and when the CLK_KEEP signal is active (e.g., the B selection signal is active).

With reference to FIG. 4, the clock divider circuit 420 includes flip-flop (FF) circuits 424 and 428. The IWCK and IWCKF signals from the input buffer 400 are provided to clock inputs of the FF circuits 424 and 428. When the IWCK and IWCKF signals are based on the WCK and WCKF signals, the FF circuits 424 and 428 are clocked by the IWCK and IWCKF signals. Clocking by the IWCK and IWCKF signals causes the FF circuits 424 and 428 to receive complementary input signals at respective data inputs D and DF and provide complementary output signals at data outputs Q and QF. The clock divider circuit 420 provides multiphase clock signals IWCK0, IWCK90, IWCK180, and IWCK270 (collectively referred to as IWCKn signals).

The IWCK0 clock signal is provided at data output Q of the FF circuit 424, the IWCK90 clock signal is provided at data output Q of the FF circuit 428, the IWCK180 clock signal is provided at data output QF of the FF circuit 424, and the IWCK270 clock signal is provided at data output QF of the FF circuit 428. The IWCK0 clock signal is provided to data input D of the FF circuit 428, the IWCK90 clock signal is provided to data input DF of the FF circuit 424, the IWCK180 clock signal is provided to data input DF of the FF circuit 428, and the IWCK270 clock signal is provided to data input D of the FF circuit 424.

With reference to FIGS. 3, 4, and 5, operation of the input buffer 400 and clock divider circuit 420 will be described for an embodiment that uses the control logic circuit 500 to provide the control signals A and B to the input buffer 400. As will be described in more detail below, the input buffer 400 and the clock divider circuit 420 are used to provide active multiphase clock signals IWCK0, IWCK90, IWCK180, and IWCK270 based on the WCK and WCKF signals for a first mode and provide inactive IWCKn signals (e.g., having a constant clock level) for a second mode. A clock signal is active when the clock signal transitions between low and high clock levels periodically. Conversely, a clock signal is inactive when the clock signal maintains a constant clock level and does not transition periodically.

In the first mode, the CLK_KEEP signal is at a low logic level (and assuming the CKE signal is active) resulting in a low-level B control signal and a high level A control signal. The switch circuits 410 and 416 are enabled to provide the WCK and WCKF signals to the inputs INPUT1 and INPUT2 of the receiver circuit 418. Active WCK and WCKF signals are provided as active IWCK and IWCKF signals to the clock divider circuit 420. Based on the active IWCK and IWCKF signals (which are based on the WCK and WCKF signals), the clock divider circuit 420 provides multiphase clock signals IWCK0, IWCK90, IWCK180, and IWCK270 having a 90 degree relative phase to one another. The clock divider circuit 420 provides the multiphase IWCKn signals having a clock frequency that is one-half of a clock frequency of the WCK and WCKF signals (and one-half of a clock frequency of the IWCK and IWCKF signals). As a result, two clock cycles of the IWCK and IWCKF signals takes the same time as one clock cycle of the multiphase IWCKn signals.

As the IWCK and IWCKF (and the WCK and WCKF) signals clock between high and low clock levels, the FF circuits 424 and 428 are clocked to receive the logic levels applied to the respective data inputs D and DF and provide the logic levels at the respective data outputs Q and QF. As the logic levels of the outputs change responsive to the clocking IWCK and IWCKF signals, the logic levels at the data inputs D and DF to which the respective clock signals IWCK0, IWCK90, IWCK180, and IWCK270 are provided changes. As a result, when the IWCK and IWCKF signals clock again between high and low clock levels, the new logic levels at the respective data inputs D and DF are received and provided at the respective data outputs Q and QF. The continual clocking of the IWCK and IWCKF clock signals cause the logic levels at the data inputs and data outputs of the FF circuits 424 and 428 to change continually and periodically. Due to the FF circuits 410 and 420 being coupled in series, the resulting multiphase clock signals IWCK0, IWCK90, IWCK180, and IWCK270 have one-half the clock frequency of the IWCK and IWCKF (and WCK and WCKF) signals, as previously described.

The clock divider circuit 420 may provide the multiphase clock signals IWCK0, IWCK90, IWCK180, IWCK270 having one of the two phase relationships previously described with reference to FIG. 3. In particular, the clock divider circuit 420 may provide the multiphase clock signals IWCK0, IWCK90, IWCK180, IWCK270 having the first phase relationship (e.g., "in order") where the rising edges of the multiphase clock signals are associated with the clock edges of the IWCK clock signal, or having the second phase relationship (e.g., "out of order") where the falling edges of the multiphase clock signals clock signals are associated with the clock edges of the IWCK clock signal.

In the second mode, the CLK_KEEP signal is at a high logic level (and assuming the CKE signal is active) resulting in a high logic level B control signal and a low level A control signal. The switch circuits 410 and 416 are disabled and the switch circuits 412 and 414 are enabled to provide the VNODE1 and VNODE2 constant voltages to the inputs INPUT1 and INPUT2 of the receiver circuit 418, respectively. With the clock inputs CLK and CLKF of the FF circuits 424 and 428 provided with constant voltages, the multiphase clock signals IWCK0, IWCK90, IWCK180, and IWCK270 also remain constant, that is, the multiphase clock signals are inactive.

By switching between providing active clock signals (first mode) and constant voltages (second mode) to the clock divider circuit 420, the provision of active and inactive multiphase clock signals IWCK0, IWCK90, IWCK180, and IWCK270 may be controlled. Additionally, the clock divider circuit 420 may be used to maintain a phase relationship of the multiphase clock signals IWCKn with the WCK signal (and WCKF signal) during the second mode. As a result, upon entering the first mode from the second mode to provide active WCK and WCKF signals to the clock divider circuit 420. the phase relationship between the multiphase clock signals IWCKn provided by the clock divider circuit 420 and the WCK signal (and WCKF signal) is the same as the phase relationship at the time the second mode was previously entered.

Figure 6:
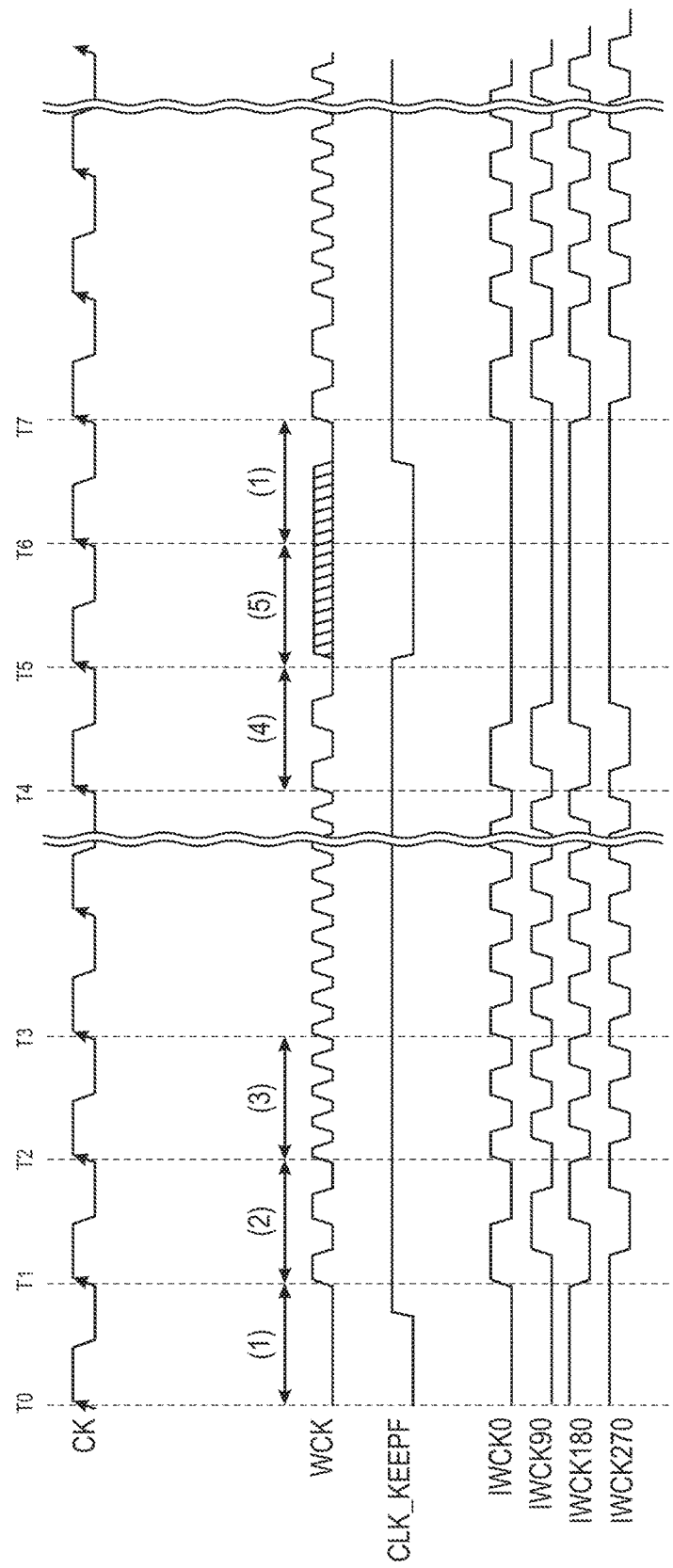
FIG. 6 is a timing diagram of various signals during operation of the input buffer and the clock divider circuit of FIG. 4 according to an embodiment of the disclosure.

FIG. 6 is a timing diagram of various signals during operation of the input buffer 400 and the clock divider circuit 420 according to an embodiment of the disclosure. At time T0, an inactive CLK_KEEPF signal (e.g., low logic level) causes the input buffer 400 to provide the constant voltage VNODE1 and VNODE2 to the clock divider circuit 420 as the IWCK and IWCKF signals (not shown in FIG. 6). As a result, the clock divider circuit 420 provides inactive multiphase clock signals IWCK0, IWCK90, IWCK180, and IWCK270.

Prior to time T1, the CLK_KEEPF signal becomes active (e.g., high logic level) to cause the input buffer 400 to provide the WCK and WCKF signals (WCKF signal not shown in FIG. 6) to the clock divider circuit 420 as the IWCK and IWCKF signals. As previously described, the CLK_KEEP signal (not shown in FIG. 6) and the CLK_KEEPF signal may be provided by a control logic circuit included in a command decoder (e.g., command decoder 115 (FIG. 1). At time T1, the input buffer 400 receives active WCK and WCKF signals. The active WCK and WCKF signals are provided by the input buffer 400 as active IWCK and IWCKF signals to the clock divider circuit 420, which provides active multiphase clock signals IWCK0, IWCK90, IWCK180, and IWCK270.

The active WCK signal (and WCKF signal) may be initially provided having a first clock frequency, and then provided having a second clock frequency that is greater than the first clock frequency, as shown in FIG. 6. At time T1, the active WCK and WCKF signals are provided by the controller having a clock frequency that is twice the clock frequency of the CK signal. At time T2, after one tCK, the active WCK and WCKF signals are provided having a clock frequency that is four times the clock frequency of the CK signal (and twice the clock frequency of the WCK and WCKF signals between times T1 and T2). The increase in WCK and WCKF clock frequency at time T2 is reflected in the multiphase clock signals IWCK0, IWCK90, IWCK180, and IWCK270 having a higher frequency at time T2. The initial, lower frequency WCK and WCKF signals may be provided between times T1 and T2, and the higher frequency WCK and WCKF signals may be provided after time T2 to improve signal integrity.

At time T4 the WCK signal is provided with a lower clock frequency, which results in the clock divider circuit 420 providing lower clock frequency multiphase clock signals IWCK0, IWCK90, IWCK180, and IWCK270. The lower clock frequency WCK signal may indicate an end of the active WCK signal. After time T5, which is after the WCK signal becomes inactive, the CLK_KEEPF signal becomes inactive. The inactive CLK_KEEPF signal results in the constant voltages VNODE1 and VNODE2 being provided by the input buffer 400 as the IWCK and IWCKF signals to the clock divider circuit 420. The constant voltages cause the clock divider circuit 420 to provide inactive multiphase clock signals IWCK0, IWCK90, IWCK180, and IWCK270, and to also retain a phase relationship of the WCK-CK signals from before the CLK KEEPF signal became inactive (e.g., the WCK-CK phase relationship from prior to time T5).

While the CLK_KEEPF signal is inactive and the constant voltages VNODE1 and VNODE2 are provided to the clock divider circuit 420, the WCK and WCKF signals provided to the input buffer 400 may be ignored. Thus, regardless of the activity of the WCK and WCKF signals during the time the CLK_KEEPF signal is inactive (e.g., following time T5 to prior to time T7), the clock divider circuit 420 provides inactive IWCK0, IWCK90, IWCK180, and IWCK270 signals. Active WCK and WCKF signals may be ignored when active IWCK0, IWCK90, IWCK180, and IWCK270 signals are not needed for operation. For example, this may be the case when the IWCK0, IWCK90, IWCK180, and IWCK270 signals are not needed for a memory operation (e.g., read operation) but the controller nonetheless continues to provide active WCK and WCKF signals. Ignoring the WCK and WCKF signals, even if active, to provide inactive internal clock signals such as the IWCK0, IWCK90, IWCK180, and IWCK270 signals, may reduce power consumption in comparison to continuing to generate active IWCK0, IWCK90, IWCK180, and IWCK270 signals in response to active WCK and WCKF signals although the IWCK0, IWCK90, IWCK180, and IWCK270 signals are not needed for a memory operation. For example, the internal clock signals may not be needed when memory cells are being accessed and data is being provided to the output circuit through a data path between the output circuit and the memory array including the memory cells. Moreover, the WCK-CK phase relationship is retained while the WCK and WCKF signals are ignored by the input buffer 400 and the clock divider 420 provides inactive IWCK0, IWCK90, IWCK180, and IWCK270 signals. Retaining the WCK-CK phase relationship may avoid the need to perform a subsequent WCK-CK synchronization operation to again determine the phase relationship prior to receiving an active WCK signal.

The CLK_KEEPF signal remains inactive through time T6 to prior to time T7. As previously described, while the CLK_KEEPF signal is inactive, the input buffer 400 to provide the constant voltage VNODE1 and VNODE2 as the IWCK and IWCKF signals to the clock divider circuit 420. As a result, the clock divider circuit 420 provides inactive multiphase clock signals IWCK0, IWCK90, IWCK180, and IWCK270.

The CLK_KEEPF signal becomes active again prior to time T7. As previously described, the active CLK_KEEPF signal causes the input buffer 400 to provide the WCK and WCKF signals as the IWCK and IWCKF signals to the clock divider circuit 420. At time T7, the input buffer receives an active WCK signal (and active WCKF signal). The active WCK signal is provided by the input buffer 400 to the clock divider circuit 420 to provide active multiphase clock signals IWCK0, IWCK90, IWCK180, and IWCK270.

The same phase relationship of the WCK-CK signals is maintained following the CLK_KEEPF signal becoming active prior to time T7. In particular, a first clock edge of the active WCK signal (e.g., a rising clock edge) at time T7 results in the same WCK-CK phase relationship as the first clock edge of the active WCK signal (e.g., rising clock edge) at time T1. That is, as shown in FIG. 6, the rising clock edge of the WCK signal at times T1 and T7 are associated with a rising clock edge of the CK signal and a rising clock edge of the IWCK0 signal (i.e., an "in order" phase relationship with the IWCK0 signal). As a result, a WCK-CK synchronization operation is not needed to again determine a WCK-CK phase relationship when the active WCK signal is provided at time T7.

The same phase relationship may be maintained by having the constant voltages VNODE1 and VNODE2 corresponding to the inactive (e.g., static) clock level of the WCK signal (and the WCKF signal). For example, in the embodiment of FIG. 6, the WCK signal is provided as a low clock level when inactive (and the WCKF signal is provided as a high clock level when inactive, not shown) such as between times T0 and T1, and between times T5 and T7. A constant voltage VNODE1 at a voltage representing a low clock level (e.g., a reference voltage such as ground) and the constant voltage VNODE2 at a voltage representing a high clock level (e.g., a supply voltage greater than the voltage for the low clock level) corresponds to the inactive clock levels of the respective WCK and WCKF signals. As a result, when the CLK_KEEPF signal becomes active and the input buffer switches from providing the inactive clock levels as represented by the constant voltages VNODE1 and VNODE2 (e.g., high clock level and low clock level, respectively) to providing the WCK and WCKF signals, the clock levels of the initially inactive WCK and WCKF signals correspond with the constant voltage VNODE1 and VNODE2 (e.g., WCK at a low clock level between times T5 and T7 corresponding with the low clock level represented by VNODE1). The first clock edge of the active WCK and WCKF signals will start from the clock level represented by the same voltages as the VNODE1 and VNODE2 voltages.

Figure 7:
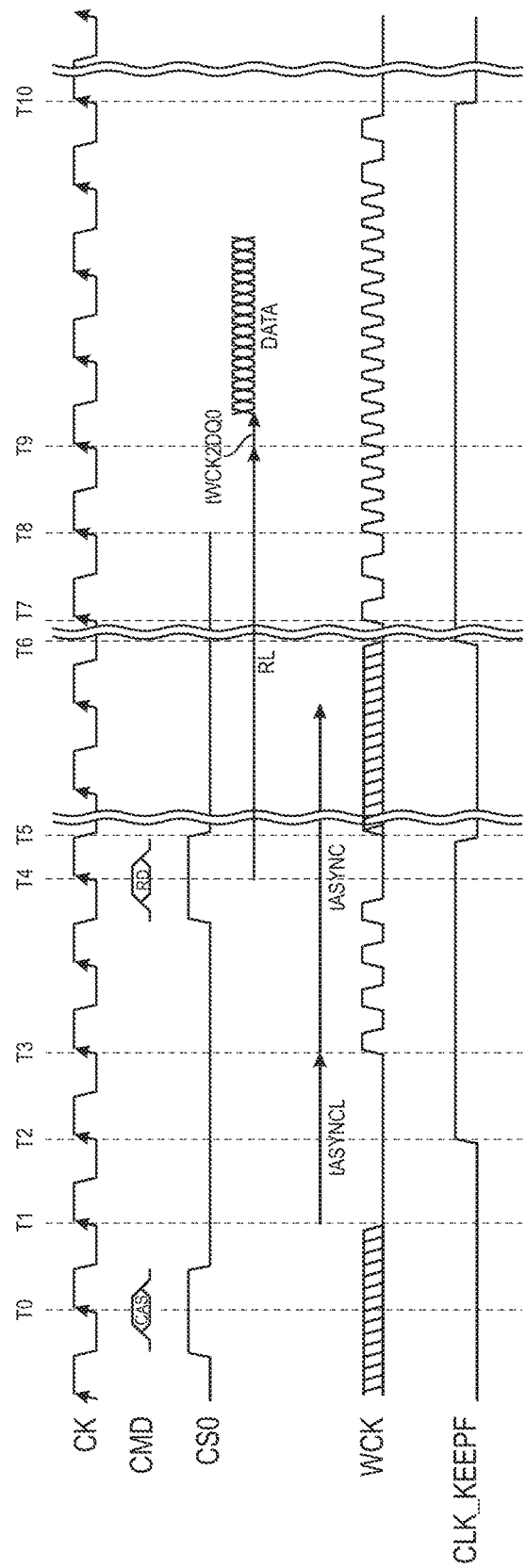
FIG. 7 is a timing diagram of various signals during an access operation according to an embodiment of the disclosure.

FIG. 7 is a timing diagram of various signals during an access operation according to an embodiment of the disclosure. FIG. 7 provides an example of switching inputs of an input buffer between receiving WCK and WCKF signals and constant voltages, for example, VNODE1 and VNODE2. As a result, generating unnecessary active internal clock signals may be avoided, and may reduce power consumption compared to continuously generating active internal clock signals when active WCK and WCKF signals are provided by a controller.

FIG. 7 will be described with reference to a system including a controller and a memory system for a read operation. The controller provides commands and WCK and WCKF signals to the memory system, and data may be transferred between the controller and memory system according to the commands. While only the WCK signal is shown in FIG. 7, it will be understood that the WCKF signal (complement to the WCK signal) is also provided by the controller to the memory system. Operation with switching between providing WCK and WCKF signals to generate internal clock signals (e.g., multiphase clock signals IWCKn) and providing constant voltages to provide inactive internal clock signals will be described with reference to FIG. 7.

At time T0 a CAS command provided by a controller is received at a memory (e.g., semiconductor device 100) that is included in the memory system. The memory is associated with select signal CS0. The CAS command includes opcodes that may be used to enable various modes related with the access operation. For example, in FIG. 7 an "autosync" mode may be enabled by the CAS command with the appropriate opcode setting. The autosync mode enable circuits in the memory to, among other things, perform WCK-CK synchronization and determine a phase relationship between the two signals. At time T1, which is one clock cycle of the CK signal (1 tCK) after the CAS command at time T0, a static period tASYNCL of 2 tCKs begins. During the tASYNCL period the WCK signal provided by the controller to the memory remains at a constant clock level. In the embodiment of FIG. 7, the WCK signal remains at a low clock level for the tASYNCL period.

A CLK_KEEPF signal becomes active (e.g., a high logic level) 2 tCK after the CAS command at time T2. The CLK_KEEPF signal, which may be provided by a command decoder (e.g., command decoder 115 in some embodiments of the disclosure) as previously described, results in the WCK and WCKF signals being received to generate internal clock signals. With reference to the input buffer 400 and clock divider circuit 420, and the control logic circuit 500, the active CLK_KEEPF signal causes the input buffer 400 to provide the WCK and WCKF signals as the IWCK and IWCKF signals to the clock divider circuit 420.

At time T3, active WCK and WCKF signals are provided by the controller for WCK-CK synchronization by the memory. In the embodiment of FIG. 7, four clock cycles of the WCK signal at twice the clock frequency of the CK signal are provided for the synchronization operation. In other embodiments of the disclosure, a different number of clock cycles and/or different clock frequencies may be used.

Following the four clock cycles of the WCK signal, the CLK_KEEPF signal becomes inactive (e.g., a low logic level) at time T5. The inactive CLK_KEEPF signal results in the constant voltages VNODE1 and VNODE2 being provided as the IWCK and IWCKF signals to the clock divider circuit 420. The constant voltages cause the clock divider circuit 420 to provide inactive multiphase clock signals IWCK0, IWCK90, IWCK180, and IWCK270, and to also retain the phase relationship of the WCK-CK signals determined from the active WCK signal provided at time T3. While the CLK_KEEPF signal is inactive and the constant voltages VNODE1 and VNODE2 are provided to the clock divider circuit 420, the WCK and WCKF signals provided to the input buffer 400 may be ignored. Thus, regardless of the activity of the WCK and WCKF signals provided during the time the CLK_KEEPF signal is inactive (e.g., represented by cross-hatching shown from time T5 to time T6), the clock divider circuit 420 provides inactive IWCK0, IWCK90, IWCK180, and IWCK270 signals and the WCK-CK phase relationship is retained. Retaining the WCK-CK phase relationship may avoid the need to perform a subsequent WCK-CK synchronization operations for the memory to again determine the phase relationship.

At time T4, an access command is received by the memory associated with select signal CS0. In the present example, the access command at T4 is a read command. The read command is provided as an example, and should not be interpreted as limiting the scope of the disclosure to only read commands and read operations. For example, write commands and write operations may be included as well.

In response to the read command at time T4, the memory will perform a read operation and provide read data at a read latency (RL) time after the read command. The read latency time may be represented by a number of clock cycles of the CK signal (e.g., RL tCK). Thus, in the embodiment of FIG. 7, the read data is provided RL tCK at after the read command (i.e., at time T4+RL=T9). The read latency time may be programmed by a controller in a mode register included in the memory.

At time T6, the CLK_KEEPF signal becomes active again. The timing of when the CLK_KEEPF signal becomes active for an access command (i.e., the read command at time T4) may be based on when the corresponding data is to be provided by the memory. For example, as previously described, the read data is provided by the memory at time T9, which is RL tCK after the access command at time T4. The controller provides an active WCK signal at time T7 in anticipation of the read data being provided by the memory at time T9. Understanding the timing of the active WCK signal from the controller, the CLK_KEEPF signal becomes active at time T6, prior to time T7, The active CLK_KEEPF signal causes the WCK and WCKF signals to be provided by the input buffer to the clock divider circuit.

At time T7, the controller provides active WCK and WCKF signals to the memory. The active WCK and WCKF signals are provided through the input butler to the clock divider circuit as the IWCK and IWCKF signals. As a result, the clock divider circuit provides active multiphase clock signals IWCK0, IWCK90, IWCK180, and IWCK270 in response to the active WCK and WCKF signals. Although not shown in FIG. 7, the multiphase clock signals may be used by the memory to generate an access data clock signal that is provided to the controller and used to time the receipt of data by the controller. The WCK and WCKF signals may be initially provided having a first clock frequency, and then provided having a second clock frequency that is greater than the first clock frequency, as shown in FIG. 7. At time T7, the active WCK and WCKF signals are provided by the controller having a clock frequency that is twice the clock frequency of the CK signal. At time T8, after one tCK, the active WCK and WCKF signals are provided having a clock frequency that is four times the clock frequency of the CK signal, and twice the clock frequency of the WCK and WCKF signals between times T7 and T8. The initial, lower frequency WCK and WCKF signals may be beneficial by improving signal integrity.

The same phase relationship of the WCK-CK signals is maintained following the CLK_KEEPF signal becoming active. In particular, a first clock edge of the active WCK signal (e.g., a rising clock edge at time T7) results in the same phase relationship as determined between times T3 and T4 relying on the four active cycles of the WCK signal. As a result, a WCK-CK synchronization operation is not needed to determine a WCK-CK phase relationship when the active WCK and WCKS signals are provided at time T7.

As previously described, the same phase relationship may be maintained by having the constant voltages VNODE1 and VNODE2 corresponding to the inactive (e.g., static) clock level of the WCK signal (and the WCKF signal). For example, in the embodiment of FIG. 7, the WCK signal is provided as a low clock level when inactive (and the WCKF signal is provided as a high clock level when inactive, not shown). A constant voltage VNODE1 at a voltage representing a low clock level (e.g., a reference voltage such as ground) and the constant voltage VNODE2 at a voltage representing a high clock level (e.g., a supply voltage greater than the voltage for the low clock level) corresponds to the inactive clock levels of the respective WCK and WCKF signals. As a result, when the CLK_KEEPF signal becomes active and the input buffer switches from providing the constant voltages VNODE1 and VNODE2 (e.g., high clock level and low clock level, respectively) to providing the WCK and WCKF signals, the clock levels of the initially inactive WCK and WCKF signals correspond with the constant voltage VNODE1 and VNODE2 (e.g., WCK at a low clock level between times T6 and T7 corresponding with the low clock level represented by VNODE1).

At time T9, or within a time period tWCK2DQO of time T9, read data is provided by the memory. As previously described, the timing of the read data at time T9 satisfies the read latency time RL. At time T10, the CLK_KEEPF signal becomes inactive so that constant voltages are provided to prevent generation of internal clock signals, regardless of the activity of the WCK and WCKF signals. The controller may provide the inactive WCK and WCKFS signals following completion of the access operation.

In the previous example, the WCK and WCKF signals are ignored between times T5 and T6. During this time, regardless of the activity of the WCK and WCKF signals, the divider circuit provides inactive internal clock signals, such as multiphase clock signals IWCK0, IWCK90, IWCK180, and IWCK270. Active multiphase clock signals IWCK0, IWCK90, IWCK180, and IWCK270 are not needed following the access command at time T4, and consequently, constant voltage signals may he provided to the input buffer and the divider circuit to provide inactive internal clock signals. Power otherwise used to provide active internal clock signals in response to the WCK and WCKF signals may be saved.

Figure 8:
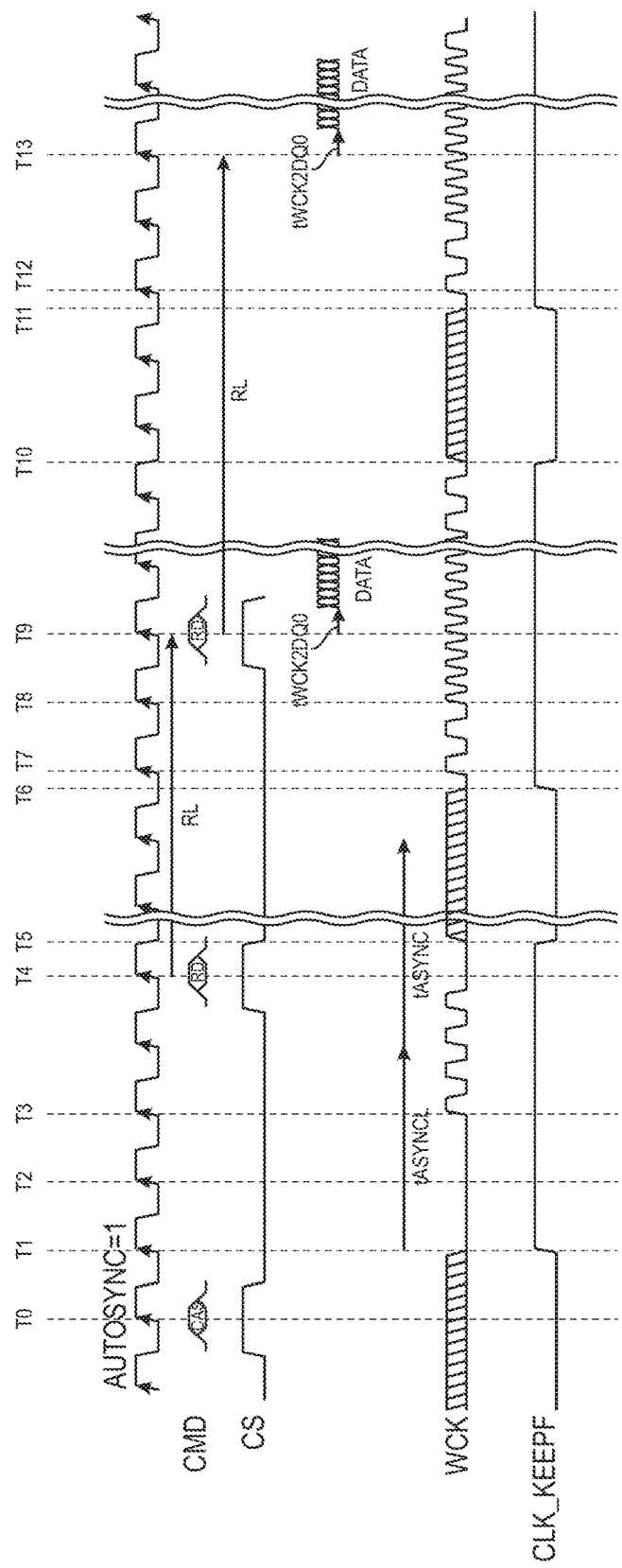
FIG. 8 is a timing diagram of various signals during an access operation according to an embodiment of the disclosure.

FIG. 8 is a timing diagram of various signals during an access operation according to an embodiment of the disclosure. FIG. 8 is similar to the timing diagram of FIG. 7, but shows an additional access operation. In particular, FIG. 8 shows an additional (i.e., second) read operation, where the inputs of the input buffer switch between receiving WCK and WCKF signals and constant voltages following the first access operation. As previously described, switching between the input buffer receiving the WCK and WCKF signal and constant voltages may reduce power consumption by avoiding the generation of unnecessary active internal clock signals, regardless of the activity of the WCK and WCKF signals provided by the controller.

The timing in FIG. 8 between times T0 through T10 are similar with that described with reference to FIG. 7, and will not be repeated tor the description of FIG. 8 for the sake of brevity. Differences between the timing diagrams of FIGS. 7 and 8, however, will be described. For example, in FIG. 8, the data provided by the memory is 8-bits while in FIG. 7 16-bits of data are provided. The switching of the input for the input buffer is not affected by the burst length of data. Also, at time T9; a second access command is received by the memory associated with select signal CS0. The read command at time T9 is provided as an example, and should not be interpreted as limiting the scope of the disclosure to only read commands and read operations. For example, write commands and write operations may be included as well. In response to the read command at time T9; the memory will perform a read operation and provide read data at the read latency (RL) time after the read command, in the embodiment of FIG. 8, the read data is provided at time T9+RL=time T13).

With reference to FIG. 8, at time T10, as previously described with reference to FIG. 7, the CLK_KEEPF signal becomes inactive so that constant voltages are provided to prevent generation of internal clock signals, regardless of the activity of the WCK and WCKF signals provided during the time the CLK_KEEPF signal is inactive (e.g., represented by cross-hatching shown from time T10 to time T11), the clock divider circuit 420 provides inactive IWCK0, IWCK90, IWCK180, and IWCK270 signals and the WCK-CK phase relationship is retained. Retaining the WCK-CK phase relationship may avoid the need to perform subsequent WCK-CK synchronization operations for the memory for a subsequent access operation.

At time T11, the CLK_KEEPF signal becomes active again and the controller provides an active WCK signal at time T12 in anticipation of the read data being provided by the memory at time T13. The active CLK_KEEPF signal causes the WCK and WCKF signals to be provided by the input buffer to the clock divider circuit. The active WCK and WCKF signals are provided through the input buffer to the clock divider circuit as the IWCK and IWCKF signals. As a result, the clock divider circuit provides active multiphase clock signals IWCK0, IWCK90, IWCK180, and IWCK270 in response to the active WCK and WCKF signals. The same phase relationship of the WCK-CK signals from before is maintained following the _KEEPF signal becoming active at time T12. By maintaining the same phase relationship as before, a WCK-CK synchronization operation is not necessary for the second access operation at time T9. At time T13, or within a time period tWCK2DQO of time T13, read data is provided by the memory. As previously described, the timing of the read data at time T13 satisfies the read latency time RL.

In the previous example, the WCK and WCKF signals are ignored between times T5 and T6 and between times T10 and T11. During these times, regardless of the activity of the WCK and WCKF signals, the divider circuit provides inactive internal clock signals, such as multiphase clock signals IWCK0, IWCK90, IWCK180, and IWCK270. Active multiphase clock signals IWCK0, IWCK90, IWCK180, and IWCK270 are not needed following the access command at time T4 and at time T9, and consequently, constant voltage signals may be provided to the input buffer and the divider circuit to provide inactive internal clock signals. Power otherwise used to provide active internal clock signals in response to the WCK and WCKF signals may be saved.

Figure 9:
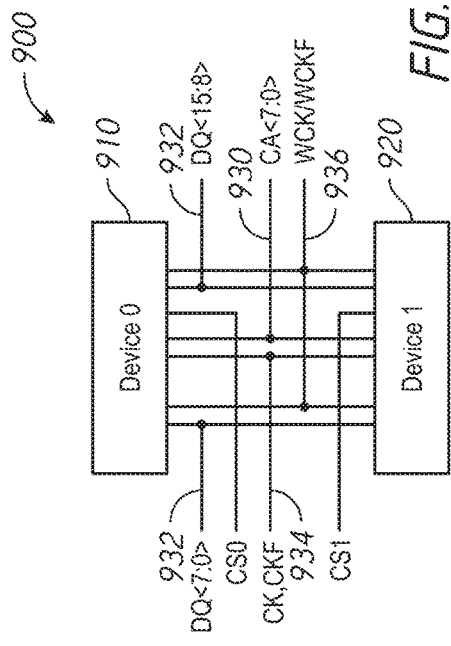
FIG. 9 is a block diagram of a memory organized in multiple ranks of memory according to an embodiment of the disclosure.

FIG. 9 is a block diagram of a memory 900 organized in multiple ranks of memory according to an embodiment of the disclosure. The memory 900 includes two ranks of memory 910 and 920. In the embodiment of FIG. 9. each rank of memory 910 and 920 is represented by respective memory device Device0 and Device1. In some embodiments of the disclosure, the memory devices Device0 and Device1 may each include the semiconductor device 100 of FIG. 1.

Both ranks of memory 910 and 920 are coupled to various busses and signal lines. For example, the ranks of memory 910 and 920 are coupled to command and address bus 930 and data bus 932. Commands and addresses CA are provided to the ranks of memory 910 and 920 on the command and address bus 930. Data are provided from and received by the ranks of memory 910 and 920 over the data bus 932, which may be bidirectional. The command and address bus 930 may be 8-bits wide and the data bus 932 may be 16-bits wide in some embodiments of the disclosure. Other embodiments may have different bit widths for the command and address bus 930 and the data bus 932 without departing from the scope of the disclosure. Both the ranks of memory 910 and 920 are also coupled to a clock busses 934 and 936. The ranks of memory 910 and 920 receive system clock signals CK and CKF on the clock bus 934 and receive data clock signals WCK and WCKF on the clock bus 936. Each of the ranks of memory 910 and 920 receive respective select signals. An active select signal causes the corresponding rank of memory to receive the commands and addresses provided on the command and address bus 910. Select signal CS0 is provided to the memory rank 910 and select signal CS1 is provided to the memory rank 920.

A memory controller (not shown in FIG. 9) may be coupled to the memory 900 through the command and address bus 930, the data bus 932, and the clock busses 934 and 936. The commands and addresses, system clock signal CK and CKF, data clock signals WCK and WCKF, and select signals CS0 and CS1 may be provided to the memory 900 by the memory controller. Data (e.g., read data) may be provided by the memory 900 to the memory controller, as well as provided by the memory controller to the memory 900 (e.g., write data).

Figure 10:
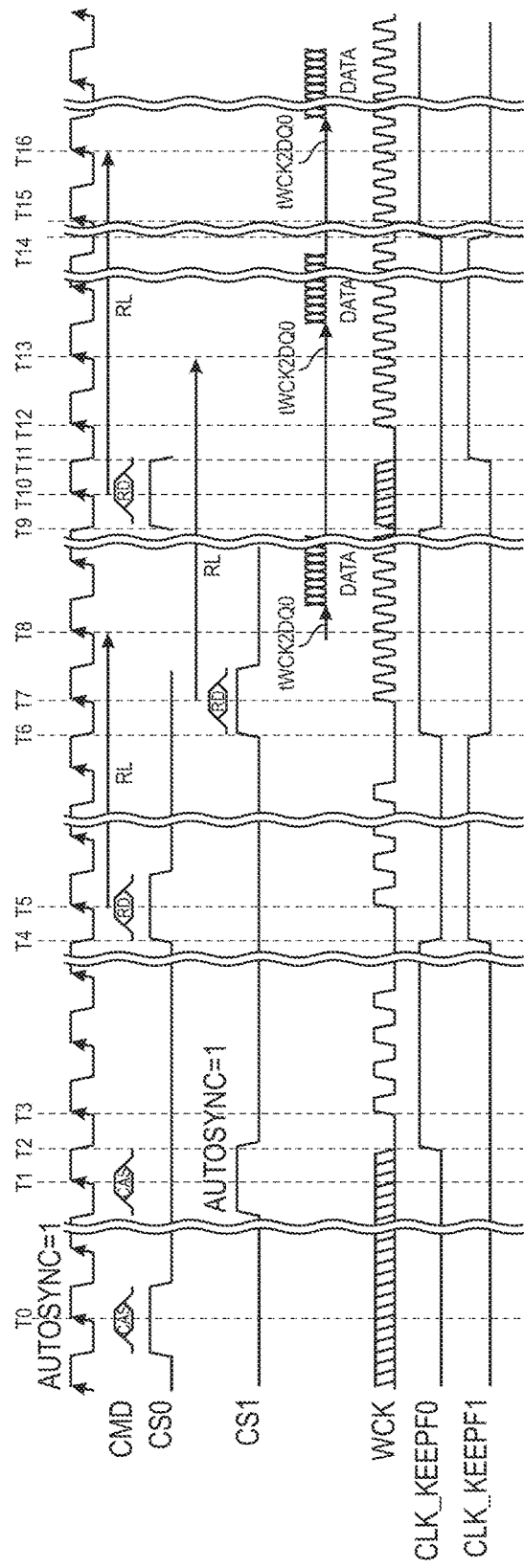
FIG. 10 is a timing diagram of various signals during an access operation between two ranks of memory according to an embodiment of the disclosure.

FIG. 10 is a timing diagram of various signals during an access operation between two ranks of memory according to an embodiment of the disclosure. FIG. 10 will be described with reference to a system including a controller and a memory system for a read operation. The memory system may include the memory 900 of FIG. 9 in some embodiments of the disclosure, and will be described with reference to the memory 900 for the purpose of providing an example. FIG. 10 will be further described with reference to the input buffer 400 and clock divider circuit 420, and the control logic circuit 500. Each of the devices of the memory 900, for the purpose of providing the example, include the input buffer 400, the clock divider circuit 420, and the control logic circuit 500.

The controller provides commands and addresses, system clock signal CK and CKF, data clock signals WCK and WCKF, and select signals CS0 and CS1 to the memory 900. While only the WCK signal is shown in FIG. 10, it will be understood that the WCKF signal (complement to the WCK signal) is also provided by the controller to the memory system. Data may be transferred between the controller and memory 900 according to the commands. In the example of FIG. 10, each rank of memory is selected by a respective select signal CS0 and CS1. Memory rank 910 is selected by an active CS0 signal and memory rank 920 is selected by an active CS1 signal.

FIG. 10 provides an example of switching inputs of an input buffer between receiving WCK and WCKF signals and constant voltages, for example, VNODE1 and VNODE2. As a result, generating unnecessary active internal clock signals may be avoided, and may reduce power consumption compared to continuously generating active internal clock signals when active WCK and WCKF signals are provided by a controller. Operation with switching between providing WCK and WCKF signals to generate internal clock signals (e.g., multiphase clock signals IWCKn) and providing constant voltages to provide inactive internal clock signals will be described with reference to FIG. 10.

At time T0 a CAS command provided by a controller is received by memory rank 910, which is selected by an active select signal CS0. The CAS command includes opcodes that may be used to enable various modes related with the access operation. For example, in FIG. 10 an "autosync" mode may be enabled by the GAS command with the appropriate opcode setting. The autosync mode enable circuits in memory to, among other things, perform WCK-CK synchronization and determine a phase relationship between clock signals. At time T1 a CAS command provided by a controller is received at memory rank 920, which is selected by an active select signal CS1. The CAS command at time T1 includes opcodes for an "autosync" mode.

At time T2, a CLK_KEEPF0 signal for memory rank 910 becomes active (e.g., a high logic level). As previously described, the CLK_KEEPF signal, which may be provided by a command decoder (e.g., command decoder 115 in some embodiments of the disclosure) as previously described. The active CLK_KEEPF0 signal results in the WCK and WCKF signals being received by the memory rank 910 to generate internal clock signals. With reference to the input buffer 400 and clock divider circuit 420. and the control logic circuit 500, the active CLK_KEEPF0 signal causes the input buffer 400 to provide the WCK and WCKF signals as the WCK and IWCKF signals to the clock divider circuit 420.

At time T3, active WCK and WCKF signals are provided by the controller for WCK-CK synchronization by memory rank 910. In the embodiment of FIG. 10, four clock cycles of the WCK signal at twice the clock frequency of the CK signal are provided for the synchronization operation by memory rank 910. In other embodiments of the disclosure, a different number of clock cycles and or different clock frequencies may be used. Following the four clock cycles of the WCK signal, the CLK_KEEPF0 signal for the memory rank 910 becomes inactive (e.g., a low logic level) at time T4. The inactive CLK_KEEPF0 signal results in the constant voltages VNODE1 and VNODE2 being provided as the IWCK and IWCKF signals to the clock divider circuit 420. The constant voltages cause the clock divider circuit 420 of the memory rank 910 to provide inactive multiphase clock signals IWCK0, IWCK90, IWCK180, and IWCK270, and to also retain the phase relationship of the WCK-CK signals determined from the active WCK signal provided at time T3. While the CLK_KEEPF0 signal is inactive and the constant voltages VNODE1 and VNODE2 are provided to the clock divider circuit 420, the WCK and WCKF signals provided to the input buffer 400 may be ignored. Thus, regardless of the activity of the WCK and WCKF signals provided to the memory rank 910 during the time the CLK_KEEPF0 signal is inactive, the clock divider circuit 420 provides inactive IWCK0, IWCK90, IWCK180, and IWCK270 signals and the WCK-CK phase relationship is retained. Retaining the WCK-CK phase relationship may avoid the need for the memory rank 910 to perform a subsequent WCK-CK synchronization operations for the memory to again determine the phase relationship for subsequent access operations.

At time T5, an access command is received by the memory rank 910 due to the active select signal CS0. In the present example, the access command at time T5 is a read command. The read command is provided as an example, and should not be interpreted as limiting the scope of the disclosure to only read commands and read operations. For example, write commands and write operations may be included as well. In response to the read command at time T5, memory rank 910 will perform a read operation and provide read data at a read latency (RL) time after the read command. The read latency time may be represented by a number of clock cycles of the CK signal (e.g., RL tCK). Thus, in the embodiment of FIG. 10, the read data is provided by the memory rank 910 RL tCK after the read command (i.e., at time T5+RL=T7). The read latency time may be programmed by a controller in a mode register included in the memory.

At time T6, the CLK_KEEPF0 signal for the memory rank 910 becomes active again. The timing of when the CLK_KEEPF0 signal becomes active for an access command (i.e., the read command for the memory rank 910 at time T5) may be based on when the corresponding data is to be provided by the memory. For example, as previously described, the read data is provided by memory rank 910 at time T8, which is RL tCK after the access command at time T5. The controller provides an active WCK signal at time T7 in anticipation of the read data being provided by the memory at time T8. Understanding the timing of the active WCK signal from the controller, the CLK_KEEPF0 signal provided by the command decoder for the memory rank 910 becomes active at time T6, prior to time T7. The active CLK_KEEPF0 signal causes the WCK and WCKF signals to be provided by the input buffer to the clock divider circuit of the memory rank 910.

At time T7, the controller provides active WCK and WCKF signals. The active WCK and WCKF signals are provided through the input buffer of the memory rank 910 to the clock divider circuit as the IWCK and IWCKF signals. As a result, the clock divider circuit provides active multiphase clock signals IWCK0, IWCK90, IWCK180, and IWCK270 in response to the active WCK and WCKF signals. Although not shown in FIG. 10, the multiphase clock signals may be used by the memory rank 910 to generate an access data clock signal that is provided to the controller and used to time the receipt of data by the controller.

The same phase relationship of the WCK-CK signals is maintained following the CLK_KEEPF0 signal for the memory rank 910 becoming active. In particular, a first clock edge of the active WCK signal (e.g., a rising clock edge at time T7) results in the same phase relationship as determined between times T3 and T4 relying on the four active cycles of the WCK signal. As a result, a WCK-CK synchronization operation is not needed by the memory rank 910 to determine a WCK-CK phase relationship when the active WCK and WCKS signals are provided at time T7.

At time T8, or within a time period tWCK2DQO of time T8, read data is provided by the memory rank 910. As previously described, the timing of the read data at time T8 satisfies the read latency time RL. At time T9, the CLK_KEEPF0 signal for the memory rank 910 becomes inactive following the WCK and WCKF signals becoming inactive. The controller may provide the inactive WCK and WCKF signals following completion of the access operation.

During the WCK-CK synchronization and access operation for memory rank 910, the WCK-CK synchronization and access operation for memory rank 920 may concurrently take place, as shown in FIG. 10.

At time T4, a CLK_KEEPF1 signal for memory rank 920 becomes active. The active CLK_KEEPF1 signal results the WCK and WCKF signals being received by the memory-rank 920 to generate internal clock signals. With reference to the input buffer 400 and clock divider circuit 420, and the control logic circuit 500, the active CLK_KEEPF1 signal causes the input buffer 400 of the memory rank 920 to provide the WCK and WCKF signals as the IWCK and IWCKF signals to the clock divider circuit 420.

At time T5, active WCK and WCKF signals are provided by the controller tor WCK-CK synchronization by memory rank 920. As with memory rank 910, four clock cycles of the WCK signal at twice the clock frequency of the CK signal are provided for the synchronization operation. Following the four clock cycles of the WCK signal, the CLK_KEEPF1 signal for the memory rank 920 becomes inactive at time T6.

The inactive CLK_KEEPF1 signal results in the constant voltages VNODE1 and VNODE2 being provided as the IWCK and IWCKF signals to the clock divider circuit 420. The constant voltages cause the clock divider circuit 420 of the memory rank 920 to provide inactive multiphase clock signals IWCK0, IWCK90, IWCK180, and IWCK270, and to also retain the phase relationship of the WCK-CK signals determined from the active WCK signal provided at time T5. While the CLK_KEEPF1 signal is inactive and the constant voltages VNODE1 and VNODE2 are provided to the clock divider circuit 420, the WCK and WCKF signals provided to the input buffer 400 may be ignored. Thus, regardless of the activity of the WCK and WCKF signals provided during the time the CLK_KEEPF signal is inactive, the clock divider circuit 420 provides inactive IWCK0, IWCK90, IWCK180, and IWCK270 signals and the WCK-CK phase relationship is retained. Retaining the WCK-CK phase relationship may avoid the need for the memory rank 920 to perform a subsequent WCK-CK synchronization operations for the memory to again determine the phase relationship for subsequent access operations.

At time T7, an access command is received by the memory rank 920 due to the active select signal CS1. In the present example, the access command at time T7 is a read command. The read command is provided as an example, and should not be interpreted as limiting the scope of the disclosure to only read commands and read operations. For example, write commands and write operations may be included as well. In response to the read command at time T7, memory rank 920 will perform a read operation and provide read data at the read latency (RL) time after the read command. The read latency time may be represented by a number of clock cycles of the CK signal (e.g., RL tCK). In the example of FIG. 10, the read data is provided by the memory rank 920 at time T7+RL=time T13.

At time T11, the CLK_KEEPF1 signal for the memory rank 920 becomes active again. The controller provides an active WCK signal at time T12 in anticipation of the read data being provided by the memory at time T13. Understanding the timing of the active WCK signal from the controller, the CLK_KEEPF1 signal provided by the command decoder for the memory rank 920 becomes active at time T11, prior to time T12. The active CLK_KEEPF1 signal causes the WCK and WCKF signals to be provided by the input buffer to the clock divider circuit of the memory rank 920.

At time T12, the controller provides active WCK and WCKF signals. The active WCK and WCKF signals are provided through the input buffer of the memory rank 920 to the clock divider circuit as the IWCK and IWCKF signals. As a result, the clock divider circuit provides active multiphase clock signals IWCK0, IWCK90, IWCK180, and IWCK270 in response to the active WCK and WCKF signals. Although not shown in FIG. 10, the multiphase clock signals may be used by the memory rank 920 to generate an access data clock signal that is provided to the controller and used to time the receipt of data by the controller.

The same phase relationship of the WCK-CK signals is maintained following the CLK_KEEPF1 signal for the memory rank 920 becoming active. In particular, a first clock edge of the active WCK signal (e.g., a rising clock edge at time T12) results in the same phase relationship as determined between times T5 and T6 relying on the four active cycles of the WCK signal. As a result, a WCK-CK synchronization operation is not needed by the memory rank 920 to determine a WCK-CK phase relationship when the active WCK and WCKS signals are provided at time T12.

At time T13, or within the time period tWCK2DQO of time T13, read data is provided by the memory rank 920. As previously described, the timing of the read data at time T13 satisfies the read latency time RL. At time T14, the CLK_KEEPF1 signal for the memory rank 920 becomes inactive following the WCK and WCKF signals becoming inactive. The controller may provide the inactive WCK and WCKF signals following completion of the access operation.

During the access operation for memory rank 920, another access operation for memory rank 910 may concurrently take place, as also shown in FIG. 10.

At time T10, an access command is received by the memory rank 910 due to the active select signal CS0. In the present example, the access command at time T10 is a read command. In response to the read command at time T10, memory rank 910 will perform a read operation and provide read data at the read latency (RL) time after the read command. In the embodiment of FIG. 10, the read data is provided by the memory rank 910 at time T10+RL=time T16.

At time 114, the CLK_KEEPF0 signal for the memory rank 910 becomes active again. The controller provides an active WCK signal at time T15 in anticipation of the read data being provided by the memory at time T16. The active CLK_KEEPF0 signal causes the WCK and WCKF signals to be provided by the input buffer to the clock divider circuit of the memory rank 920.

At time T15, the controller provides active WCK and WCKF signals. The active WCK and WCKF signals are provided through the input buffer of the memory rank 910 to the clock divider circuit as the IWCK and IWCKF signals. As a result, the clock divider circuit provides active multiphase clock signals IWCK0, IWCK90, IWCK180, and IWCK270 in response to the active WCK and WCKF signals. As previously described, the multiphase clock signals may be used by the memory rank 910 to generate an access data clock signal that is provided to the controller and used to time the receipt of data by the controller.

The same phase relationship of the WCK-CK signals is maintained following the CLK_KEEPF0 signal for the memory rank 910 becoming active. In particular, a first clock edge of the active WCK signal (e.g., a rising clock edge at time T15) results in the same phase relationship as determined earlier by the memory rank 910 and used for the earlier access command at time T5. Maintaining the phase relationship avoids any need to perform another WCK-CK synchronization operation by the memory rank 910 for the subsequent access operation at time T10.

At time T16, or within a time period tWCK2DQO of time T16, read data is provided by the memory rank 920. As previously described, the timing of the read data at time T16 satisfies the read latency time RL.

In the previous example of FIG. 10, the WCK and WCKF signals are ignored by the memory rank 910 between times T4 and T6, and again between times T9 and T14, and ignored by the memory rank 920 between times T6 and T11. During the respective times, regardless of the activity of the WCK and WCKF signals, the divider circuits of the memory ranks 910 and 920 provide inactive internal clock signals, such as multiphase clock signals IWCK0, IWCK90, IWCK180, and IWCK270. Active multiphase clock signals are not needed by the memory rank 910 following the access command at time T4 and before T6, and again following the access command at time T10 and before lime T14, and active multiphase clock signals are not needed by the memory rank 920 following the access command at time T7 and before T11. Not generating active internal clock signals when unnecessary for the memory operation may reduce power consumption by the memory ranks 910 and 920.

From the foregoing, it will be appreciated that, although specific embodiments of the disclosure have been described herein tor purposes of illustration, various modifications may be made without deviating from the spirit and scope of the disclosure. Accordingly, the scope disclosure should not be limited any of the specific embodiments described herein.

What is claimed is:

1. An apparatus, comprising:
    an input clock buffer, the input clock buffer including a receiver circuit configured to receive first and second clock signals or first and second constant voltages and provide first and second output signals based on the complementary clock signals or the first and second constant voltages, the first and second clock signals complementary and the second constant voltage is less than the first constant voltage: wherein the input clock buffer further includes:
        a first switch circuit configured to receive the first clock signal and provide the first clock signal to a first input of the receiver circuit when activated;
        a second switch circuit configured to receive the first constant voltage and provide the first constant voltage to the first input of the receiver circuit when activated;
        a third switch circuit configured to receive the second clock signal and provide the second clock signal to a second input of the receiver circuit when activated; and
        a fourth switch circuit configured to receive the second constant voltage and provide the second constant voltage to the first input of the receiver circuit when activated; and
    a clock divider circuit coupled to the input clock buffer and configured to receive the first and second output signals, the clock divider circuit further configured to provide multiphase clock signals based on the first and second output signals from the input clock buffer.

2. The apparatus of claim 1 wherein the first and third switch circuits are activated concurrently and the second and fourth switch circuits are activated concurrently, and wherein the first and third switch circuits are not activated at the same time as the second and fourth switch circuits.

3. The apparatus of claim 1 wherein the clock divider circuit comprises:
    a first flip-flop circuit; and
    a second flip-flop circuit, wherein the first and second flip-flop circuits are both clocked responsive to the first and second and second output signals from the input clock buffer.

4. The apparatus of claim 1 wherein the clock divider circuit is configured to provide active multiphase clock signals responsive to receiving active first and second clock signals as the first and second output signals from the input clock signals.

5. An apparatus, comprising:
    an input clock buffer, the input clock buffer including a receiver circuit configured to receive first and second clock signals or first and second constant voltages and provide first and second output signals based on the complementary clock signals or the first and second constant voltages, the first and second clock signals complementary and the second constant voltage is less than the first constant voltage; and a clock divider circuit coupled to the input clock buffer and configured to receive the first and second output signals, the clock divider circuit further configured to provide multiphase clock signals based on the first and second output signals from the input clock buffer; wherein the clock divider circuit is configured to provide inactive multiphase clock signals responsive to receiving the first and second constant voltages as the first and second output signals from the input clock buffer.

6. An apparatus, comprising:
an input clock buffer, the input clock buffer including a receiver circuit configured to receive first and second clock signals or first and second constant voltages and provide first and second output signals based on the complementary clock signals or the first and second constant voltages, the first and second clock signals complementary and the second constant voltage is less than the first constant voltage; wherein the first constant voltage comprises a voltage corresponding to a static clock level of the first clock signal and the second constant voltage comprises a voltage corresponding to a static clock level of the second clock signal; and
a clock divider circuit coupled to the input clock buffer and configured to receive the first and second output signals, the clock divider circuit further configured to provide multiphase clock signals based on the first and second output signals from the input clock buffer.

7. An apparatus, comprising:
an internal clock circuit configured to provide internal clock signals based on buffered input signals;
a clock signal input circuit configured to receive a data clock signal and provide the data clock signal or constant voltages as the buffered input signals to the internal clock circuit; and
a command decoder configured to receive internal commands and provide control signals, including activation signals provided to the clock signal input circuit to control the provision of the buffered input signals.

8. The apparatus of claim 7 wherein the internal clock circuit comprises a clock divider circuit configured to provide multiphase clock signals based on the buffered input signals.

9. The apparatus of claim 7 wherein the internal clock circuit comprises a clock divider circuit configured to provide quadrature phase clock signals based on the buffered input signals.

10. The apparatus of claim 7 wherein the constant voltages provided as the buffered input signals correspond to static clock levels of the data clock signals.

11. The apparatus of claim 7 wherein the clock signal input circuit comprises a plurality of switch circuits and a receiver circuit, the plurality of switch circuits configured to provide the data clock signal or the constant voltages to inputs of the receiver circuit based on the activation signals.

12. The apparatus of claim 7 wherein the command decoder is configured to provide the activation signals to cause the clock signal input circuit to provide the data clock signals as the buffered input signals in preparation for data to be output from an input/output circuit.

13. The apparatus of claim 7 wherein the data clock signal is a first data clock signal and wherein the clock signal input circuit is configured to receive a second data clock signal that is complementary to the first data clock signal, the clock signal input circuit further configured to provide the first and second data clock signals or the constant voltages as the buffered input signals.

14. A method, comprising:
receiving active first and second clock signals at an input buffer;
providing active internal clock signals from the input buffer based on the active first and second clock signals;
generating active multiphase clock signals from the active internal clock signals;
providing first and second constant voltages from the input buffer as inactive internal clock signals; and
generating inactive multiphase clock signals from the inactive internal clock signals.

15. The method of claim 14 wherein providing constant voltages from the input buffer as inactive clock signals comprises:
deactivating switch circuits configured to receive the first and second first and second clock signals and provide the same to the input buffer when activated; and
activating switch circuits configured to receive the first and second constant voltages and provide the same to the input buffer when activated.

16. The method of claim 14 wherein the first and second constant voltages are provided by the input buffer as inactive internal clock signals while the first and second clock signals are active.

17. The method of claim 14, further comprising switching from providing first and second constant voltages as inactive internal clock signals from the input buffer to providing active internal clock signals from the input buffer based on the active first and second clock signals.

18. The method of claim 14, further comprising maintaining a phase relationship between the multiphase clock signals and the first and second clock signals during the first and second constant voltages being provided from the input buffer as inactive internal clock signals.

19. The method of claim 14, further comprising determining a phase relationship between the first and second clock signals and the multiphase clock signals.

20. The method of claim 19, further comprising:
after generating inactive multiphase clock signals from the inactive internal clock signals, providing active internal clock signals from the input buffer based on the active first and second clock signals; and
generating active multiphase clock signals from the active internal clock signals,
wherein the active multiphase clock signals have the same phase relationship with the first and second clock signals as before generating inactive multiphase clock signals from the inactive internal clock signals.

* * * * *